US008222917B2

(12) United States Patent
Oliva et al.

(10) Patent No.: US 8,222,917 B2
(45) Date of Patent: Jul. 17, 2012

(54) IMPEDANCE MATCHING AND TRIMMING APPARATUSES AND METHODS USING PROGRAMMABLE RESISTANCE DEVICES

(75) Inventors: Antonietta Oliva, San Jose, CA (US); Louis Charles Kordus, Sunnyvale, CA (US); Vei-Han Chan, San Jose, CA (US)

(73) Assignee: Agate Logic, Inc., Cupertino, CA (US)

( * ) Notice: Subject to any disclaimer, the term of this patent is extended or adjusted under 35 U.S.C. 154(b) by 0 days.

(21) Appl. No.: 11/591,734

(22) Filed: Nov. 2, 2006

(65) Prior Publication Data
US 2007/0188187 A1 Aug. 16, 2007

Related U.S. Application Data

(60) Provisional application No. 60/733,527, filed on Nov. 3, 2005.

(51) Int. Cl.
*H03K 17/16* (2006.01)
*H03K 19/003* (2006.01)

(52) U.S. Cl. ............... 326/30; 326/86; 257/298

(58) Field of Classification Search ............ 326/30, 326/68, 82–83, 86; 257/200, 296, 298
See application file for complete search history.

(56) References Cited

U.S. PATENT DOCUMENTS

| | | | |
|---|---|---|---|
| 5,254,883 A * | 10/1993 | Horowitz et al. | 326/30 |
| 6,424,200 B1 | 7/2002 | McNitt et al. | |
| 6,445,245 B1 * | 9/2002 | Schultz et al. | 327/541 |
| 6,489,837 B2 | 12/2002 | Schultz et al. | |
| 6,836,142 B2 * | 12/2004 | Lesea et al. | 326/30 |
| 6,894,305 B2 * | 5/2005 | Yi et al. | 257/4 |
| 6,937,055 B2 * | 8/2005 | Roy et al. | 326/30 |
| 7,148,720 B2 * | 12/2006 | Chen | 326/30 |
| 7,186,998 B2 | 3/2007 | Ovshinsky et al. | |
| 7,547,906 B2 * | 6/2009 | Ovshinsky | 257/3 |
| 2002/0114146 A1 | 8/2002 | Bergman et al. | |
| 2004/0124406 A1 * | 7/2004 | Campbell et al. | 257/4 |
| 2004/0178401 A1 * | 9/2004 | Ovshinsky et al. | 257/2 |
| 2004/0178403 A1 * | 9/2004 | Ovshinsky | 257/4 |
| 2004/0179394 A1 | 9/2004 | Ovshinsky et al. | |

(Continued)

OTHER PUBLICATIONS

IEEE, Inc., edited by Anantha Chandrakasan et al., "Design of High-Performance Microprocessor Circuits", 2001, Chapter 19, p. 397, IEEE Press, Piscataway, NJ, USA.

(Continued)

*Primary Examiner* — Jason M Crawford
(74) *Attorney, Agent, or Firm* — JW Law Group; James M. Wu

(57) ABSTRACT

Impedance matching and trimming apparatuses and methods using programmable resistance devices. According to one exemplary embodiment, the impedance matching circuit includes a programmable resistance element, a comparator, a resistor divider having a common node coupled to a first input of the comparator, and an impedance element control circuit coupled between an output of the comparator and the programmable resistance element. The programmable resistance element includes one or more programmable resistance devices (PRDs). Programmed resistances of the programmable resistance element combine with the resistance of an external reference resistor to provide an impedance matched termination. A change in the resistance of the termination impedance causes a change in the output of the comparator. The impedance element control circuit responds to changes in the output of the comparator by providing one or more program control output signals, which control the resistance values of one or more of the PRDs, thereby maintaining an impedance matched termination.

38 Claims, 17 Drawing Sheets

U.S. PATENT DOCUMENTS

2004/0245557 A1* 12/2004 Seo et al. .................. 257/298
2004/0246804 A1* 12/2004 Cho et al. .................. 365/225.7
2006/0071244 A1*  4/2006 Gutsche et al. ............. 257/250
2006/0102927 A1   5/2006 Fujita et al.
2007/0085444 A1*  4/2007 Pinkerton et al. .......... 310/309

OTHER PUBLICATIONS

Michael N. Kozicki et al., "Non-Volatile Memory Based on Solid Electrolytes", Center for Solid State Electronics Research, Arizona State University, Nov. 2004, Tempe, AZ, USA.

Michael N. Kozicki et al., Presentation entitled "Non-Volatile Memory Based on Solid Electrolytes", presented at Axon Technologies Corp. Scottsdale, AZ, USA, www.axontc.com.

Ovonyx, Inc., "Ovonic Unified Memory", Short technical presentation in HTML, Ovonyx, Inc., Rochester Hills, MI, USA, www.ovonyx.com.

Ovonyx, Inc., "Market Applications of Ovonic Unified Memory (OUM)", Ovonyx, Inc., Rochester Hills, MI, USA, www.ovonyx.com.

Ovonyx, Inc., "OUM-Ovonic Unified Memory", Technical presentation in Adobe Acrobat Format, Ovonyx, Inc., Rochester Hills, MI, USA www.ovonyx.com.

* cited by examiner

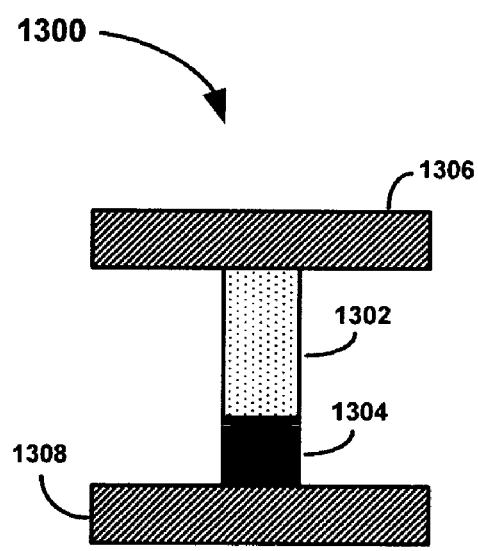
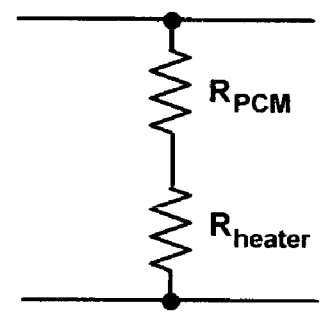
FIGURE 13A
FIGURE 13B

US 8,222,917 B2

IMPEDANCE MATCHING AND TRIMMING APPARATUSES AND METHODS USING PROGRAMMABLE RESISTANCE DEVICES

CROSS-REFERENCE TO RELATED APPLICATIONS

This patent application claims the benefit of U.S. Provisional Patent Application No. 60/733,527, filed on Nov. 3, 2005, the disclosure of which is hereby incorporated by reference.

FIELD OF THE INVENTION

The present invention generally relates to impedance matching and trimming circuits. More specifically the present invention relates to impedance matching and trimming circuits using programmable resistance devices (PRDs).

BACKGROUND OF THE INVENTION

Due to inaccuracies involved in processes used to fabricate integrated circuits (ICs), particularly analog ICs, certain circuit components of an IC must be tuned (i.e., "trimmed") in order to achieve a desired performance or functionality. For example, termination impedances between the inputs and outputs (I/Os) of two ICs (or "chips") on a printed circuit board (PCB) are often trimmed to reduce signal reflections and maintain signal integrity.

In high-speed I/O circuits, impedance matching of the links and buses between chips on a PCB is particularly important. As shown in FIG. 1, a typical high-speed link 100 on a PCB consists of a transmitter 102, a transmission line 104 and a receiver 104. The transmission line in a typical application comprises several sections (see FIG. 2): metallization 202 on the transmitter chip itself; bond wire 204 that connects the chip to a package leadframe; an electrical connection 206 between the leadframe and the PCB; a wire trace 208 that connects the package leadframe to a backplane; and corresponding sections from the backplane to the receiver chip 210.

In some applications, impedance mismatches between adjacent sections can be minimized by adding off-chip termination resistors at the transmitter side, the receiver side, or both. These off-chip termination resistors match the output and input impedances of the transmitter and receiver chips to the transmission line impedance. FIGS. 3A-C show various examples of how off-chip resistors may be utilized to minimize impedance mismatches. In particular, FIG. 3A shows a receiver side termination using a single parallel resistor 106. FIG. 3B shows a receiver side termination using a Thévenin resistor pair 107 and 108. And, FIG. 3C shows a transmitter side termination with a serial resistor 108.

While the simple solution of inserting off-chip resistors to minimize impedance mismatches can be effective in some low-frequency applications, it is not a viable solution for high-speed applications. In high-speed applications, the termination resistors must be placed as close as possible to the chips. This is not an easy task. Indeed, in complex ICs having a large number of closely spaced I/Os, placement of the termination resistors cannot even be performed at all.

To avoid the problems associated with placement of off-chip resistors, on-chip termination resistors may alternatively be used. On-chip resistors can offer a better impedance matching solution, since they are on-chip and, therefore, can be located closer to the transmitter and receiver than can off-chip resistors. However, the on-chip resistors that are traditionally used—unsilicided polysilicon resistors or n-well resistors—have various disadvantages. First, their resistance values vary substantially over typical voltage and temperature operating ranges. Second, they require substantial chip area to implement. Third, additional process steps and additional masks are required to manufacture the on-chip resistors. Finally, the on-chip resistors cannot be adjusted once they are formed. This limitation can make it difficult to provide an accurate impedance match and does not allow the resistor to be adjusted at a later time.

One way to make termination resistors adjustable is to use transistor or resistor arrays in combination with a comparator circuit. This approach is shown in FIG. 4A. The adjustable impedance matching apparatus 400 includes a group 402 of parallel transistors, a comparator 404 having a resistor divider (first and second resistors 406 and 408), which is coupled to the comparator's non-inverting input, an external reference resistor 410 ($R_{Ref}$), which is coupled to the inverting input of the comparator, and an impedance element control block 412 coupled between the group of parallel transistors 402 and the output of the comparator 404.

The comparator 404 compares the voltage at its inverting input to the voltage at the common node of the resistor divider. Depending on the comparator output, the impedance control block 412 either turns ON or turns OFF one or more of the transistors in the group of parallel transistors 402 until the voltages at the inputs of the comparator 404 are the same. The desired impedance of the group of parallel transistors 402 can be determined, therefore, by proper selection of the ratio of the first and second resistors 406 and 408 and the reference resistor 410.

One problem with the adjustable impedance matching apparatus in FIG. 4A is that the resistances provided by the transistors can be nonlinear. To reduce the effect of the nonlinear transistor resistances, a resistor 414 may be added in series with the group of parallel transistors 402, as shown in FIG. 4B. However, these added resistors are usually unsilicided polysilicon resistors and, undesirably, take up the same amount of chip area, require the same additional process steps, and provide the same unacceptably large variations in resistance as do the on-chip termination resistors described above. In addition to these problems, the array of resistors and transistors undesirably occupies area on the chip which would otherwise be available for other circuitry. Addition of the transistors and resistors also complicates the semiconductor fabrication processes.

Given the foregoing problems and limitations of prior art impedance matching approaches, it would be desirable to have impedance matching and trimming methods and apparatuses that: provides precise resistance values over the range of IC process variation, operating temperature, operating voltage, and operating life; uses a minimum of IC surface area; and does not require introduction of an excess number of steps in the IC fabrication and assembly process.

BRIEF SUMMARY OF THE INVENTION

Methods and apparatuses for trimming integrated circuit resistors and impedance matching input/output (I/O) circuits to off-chip components and transmission lines are disclosed. According to one exemplary embodiment, an adjustable impedance matching circuit includes a programmable resistance element that is employed in the pull-up leg of a driver. The impedance of the pull-up leg is adjusted by tuning the resistance of the programmable resistance element to a value that provides an impedance match to an off-chip impedance (e.g., the impedance of a transmission line or other circuit off-chip component). The resistance tuning is controlled by an impedance element control block, which controls the characteristics of the programming pulses (e.g., amplitude, duration, rise and fall times, repeated application of pulses, etc.) In accordance with one aspect of the invention, programmable resistance elements comprise one or more phase change devices (PCDs), programmable metallization devices (PMCs), or other programmable resistance elements such as, for example, nanoelectromechanical (NEM) devices.

The trimming and impedance matching apparatuses and methods of the present invention offer various advantages over prior art trimming and impedance matching approaches. First, an area reduction of I/Os is achieved by replacing prior art active and passive impedance matching or trimming devices with a single or few small-sized programmable resistance devices. Second, dynamic and precise adjustment of input and output impedances of integrated circuits can be performed during operation and over the product life of the integrated circuit, to compensate for drift in the operational characteristics of circuitry in the integrated circuits (e.g., drivers, which couple to off-chip transmission lines or other off-chip components) and variances in operating conditions such as voltage and temperature. Third, the programmable resistance elements can be integrated as part of the integrated circuit, and consequently do not need to be placed off-chip (e.g., on a printed circuit board (PCB)). This advantage reduces the cost and development time of the PCB, allows for better signal integrity, since the termination resistance can be placed very close to the driver, and improves the reliability of the system into which the integrated circuit is used, since no additional components (like, for example, termination resistors) are required on the PCB. Fourth, the mask adders and processing costs required to implement the apparatuses of the present invention are less than or comparable to use of conventional polysilicon or thin film TiN or TaN resistors.

Further features and advantages of the present invention, as well as the structure and operation of the various embodiments of the present invention, are described in detail below with reference to accompanying drawings, in which like reference numbers are used to indicate identical or functionally similar elements.

BRIEF DESCRIPTION OF THE DRAWINGS

Aspects, advantages and novel features of the present invention will become apparent from the following description of the invention presented in conjunction with the accompanying drawings:

FIG. 13A is a simplified cross-sectional drawing of a two-terminal PCD, which may be used to implement the two-terminal PRDs in the impedance matching apparatus of FIG. 12, in accordance with an embodiment of the present invention;

FIG. 13B is an equivalent circuit diagram of the two-terminal PCD in FIG. 13A;

DETAILED DESCRIPTION OF THE INVENTION

Figure 1:
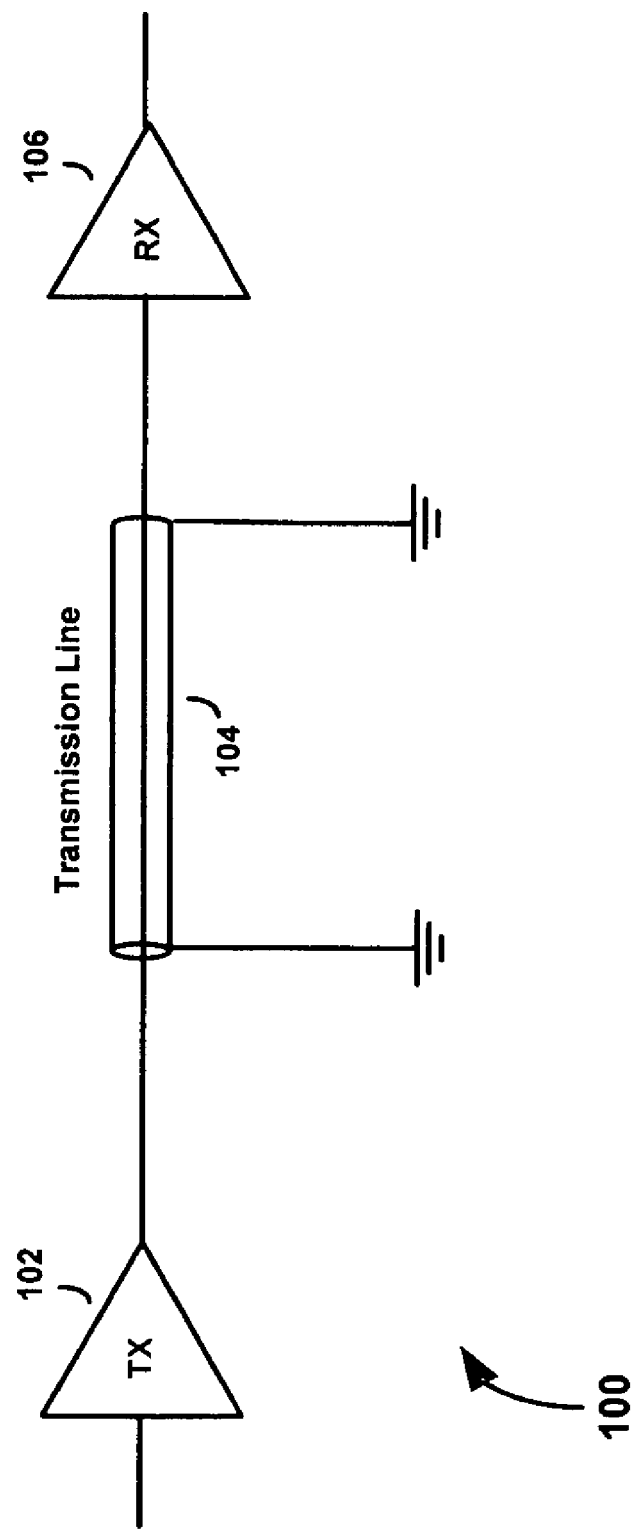
FIG. 1 is a simplified schematic drawing of a prior art data link.
Figure 2:
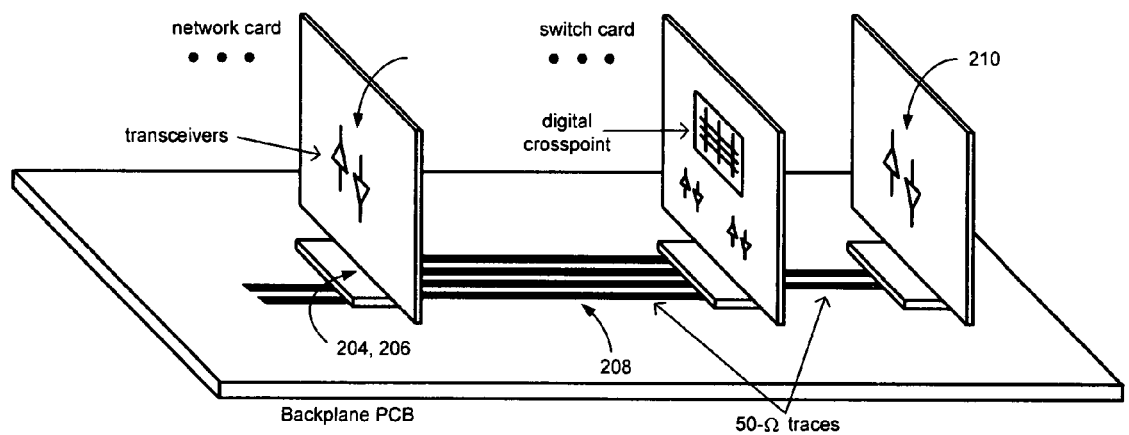
FIG. 2 is a perspective drawing of a data link illustrating various transmission sections between a transmitter and a receiver, according to a typical prior art application.
Figure 3A:
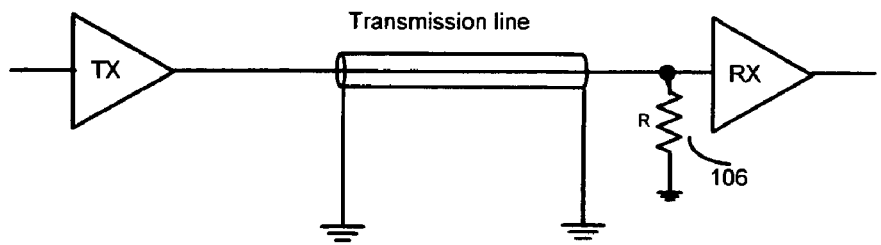
FIG. 3A is a simplified schematic drawing of a prior art data link illustrating how an impedance matching resistor may be connected in parallel between a transmission line and the input of a receiver, as is known in the prior art.
Figure 3B:
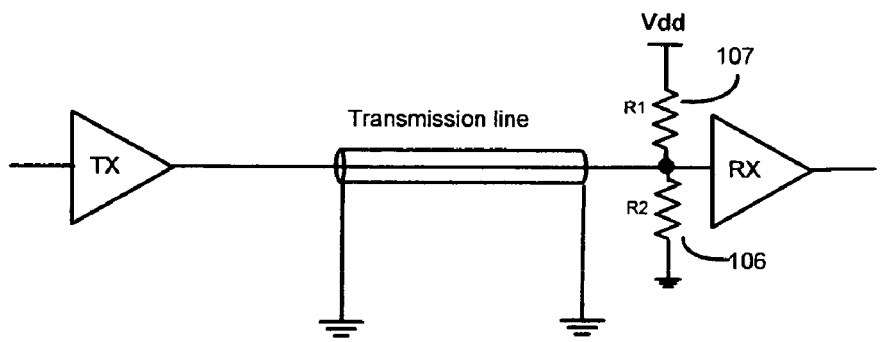
FIG. 3B is a simplified schematic drawing of a prior art data link illustrating how an impedance matching Thévenin resistance pair may be connected at the input of the data link's receiver, as is known in the prior art.
Figure 3C:
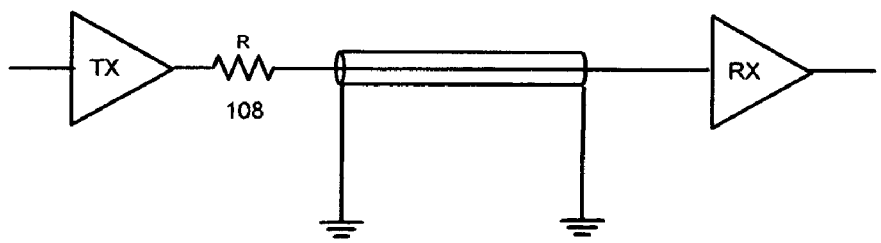
FIG. 3C is a simplified schematic drawing of a prior art data link illustrating how an impedance matching resistor may be connected in series between an output of the link's transmitter and transmission line, as is known in the prior art.
Figure 4A:
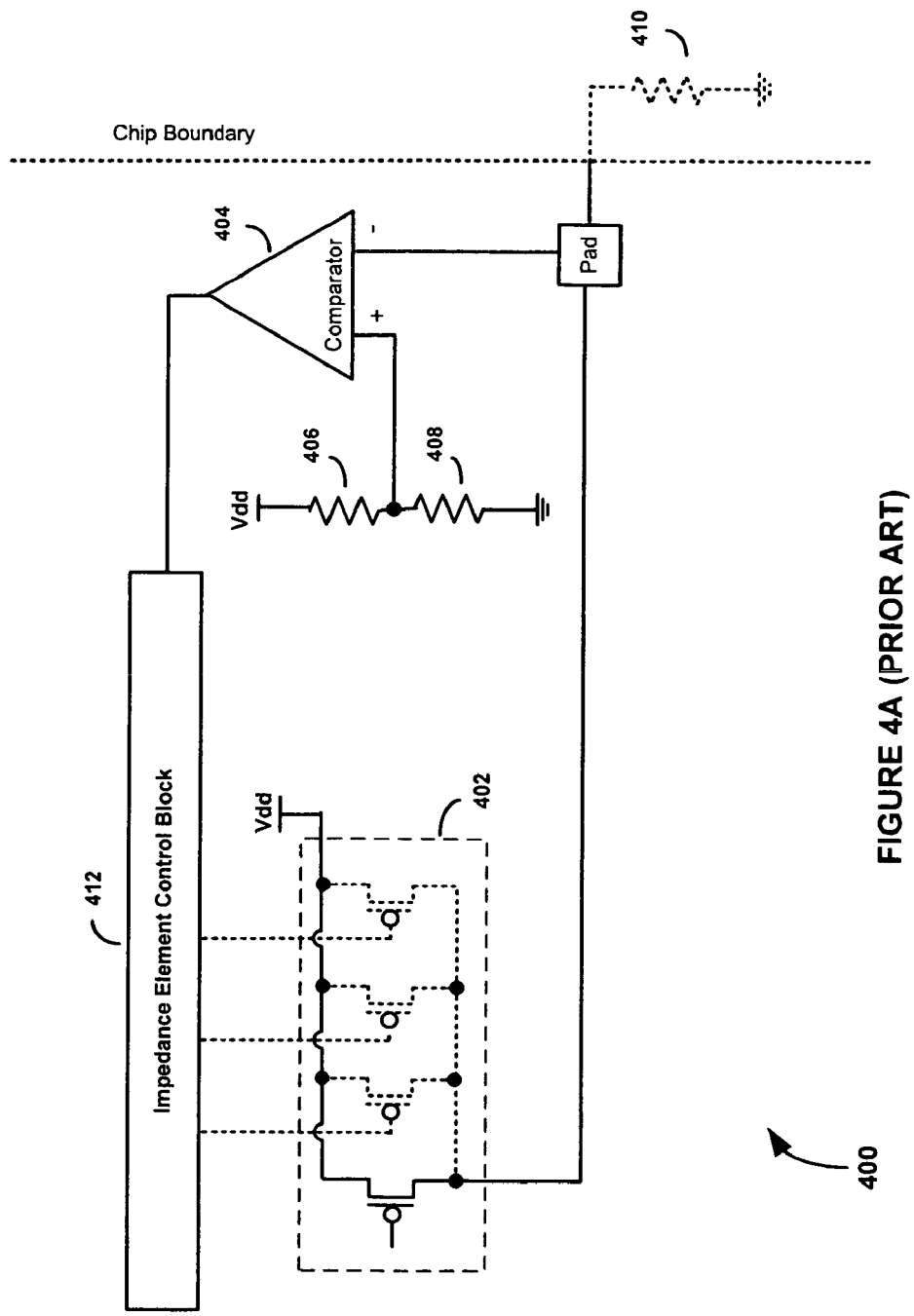
FIG. 4A is a simplified schematic drawing of a prior art adjustable impedance matching circuit.
Figure 4B:
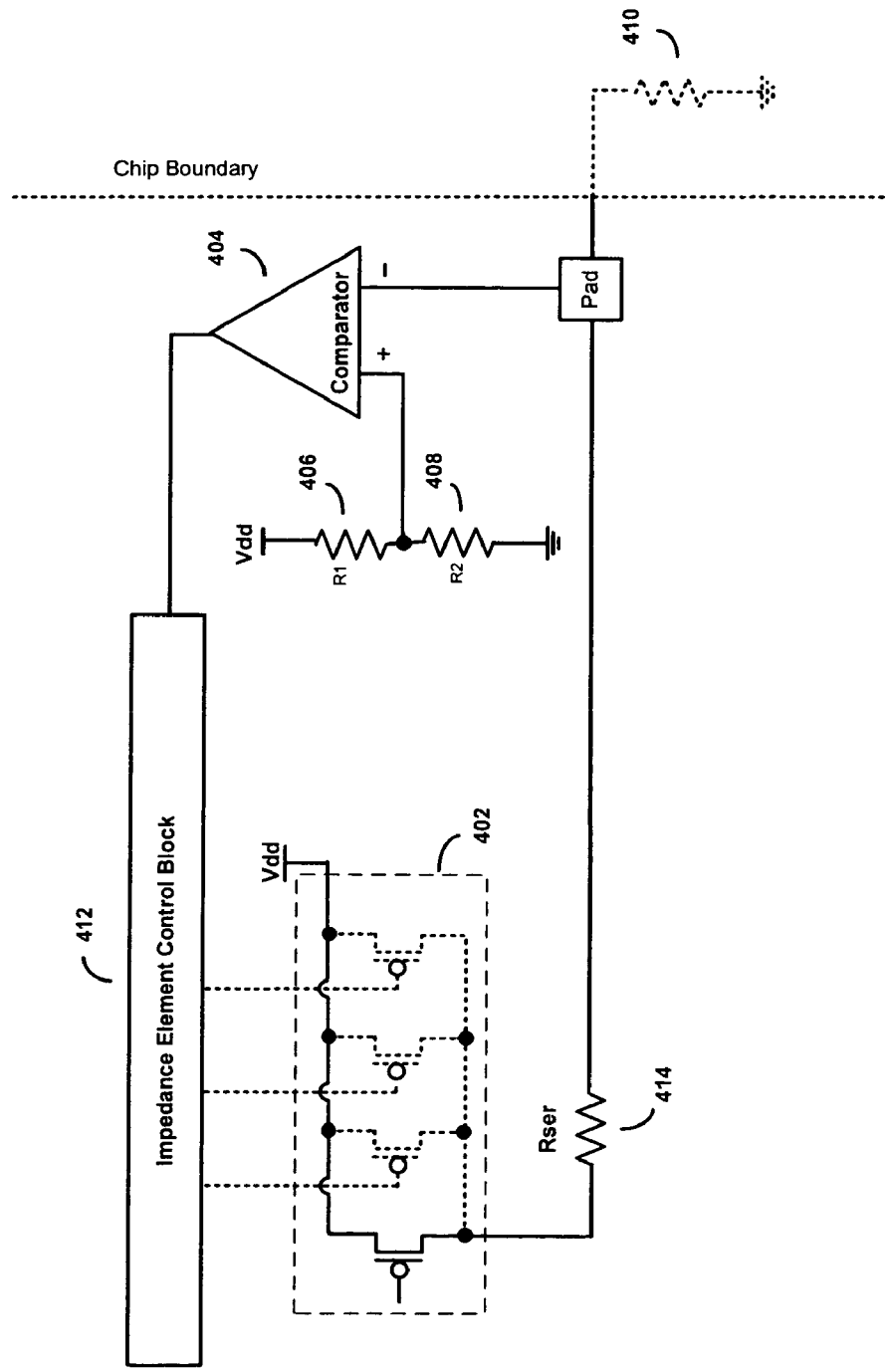
FIG. 4B is a schematic drawing of the prior art adjustable impedance matching circuit in FIG. 4A that includes an additional resistor, which is used to compensate for nonlinear transistor resistances.
Figure 5:
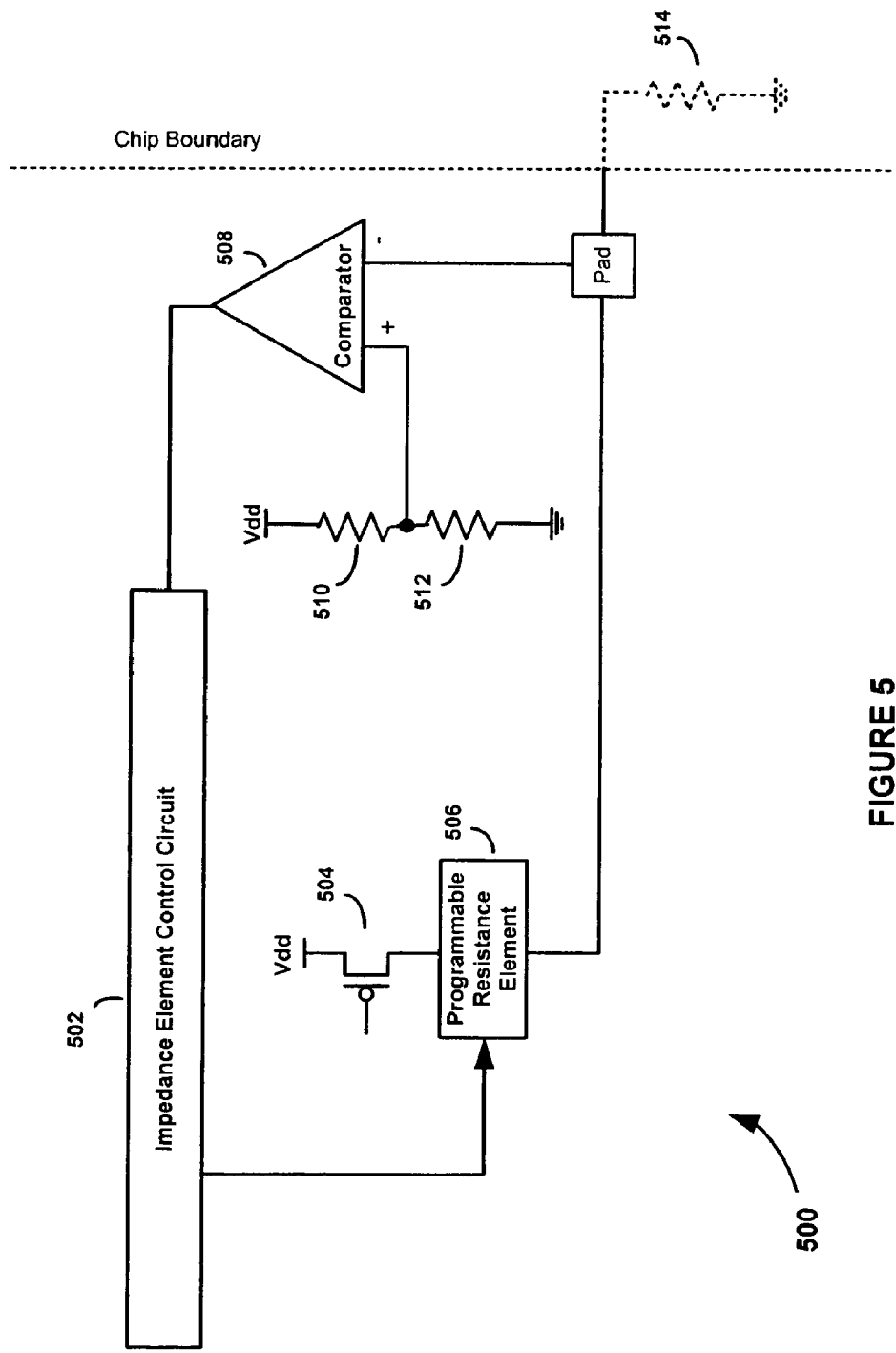
FIG. 5 is a schematic drawing of an exemplary impedance matching apparatus using a programmable resistance element, according to an embodiment of the present invention.

One or more embodiments of the present invention will now be described. Referring to FIG. 5, there is shown an impedance matching apparatus 500, according to an embodiment of the present invention. The impedance matching apparatus 500 comprises an impedance element control circuit 502, a pull-up transistor 504 (e.g., a pull-up transistor used in a pull-up leg of a driver), a programmable resistance element 506, a comparator 508, and a resistor divider including first and second resistors 510 and 512. The output of the comparator 508 is coupled to an input of the impedance element control circuit 502. A program control output from the impedance element control circuit 502 is coupled to a programming input of the programmable resistance element 506, which is coupled between the pull-up transistor 504 and the inverting input of the comparator 508. A common node of the first and second resistors 510, 512 is coupled to the non-inverting input of the comparator 508.

The comparator 508 generates an output signal proportional to the difference in voltages applied to its inverting and non-inverting inputs. In response to this output signal, the impedance element control circuit 502 provides a control signal to the programming input of the programmable resistance element 506. As explained in exemplary embodiments below, one or more program control output signals from the impedance element control circuit are operable to program (or affect the programming of) the programmable resistance element 506 to a high-resistance, a low-resistance state or to some intermediate resistance value. An equivalent resistance formed by the combination of the programmable resistance element and an external reference resistor 514 ($R_{Ref}$) allows the termination impedance of the pull-up leg to match properly to an external transmission line or other circuit component. Because the programmable resistance element is dynamically adjusted during operation, an impedance match can be maintained over the lifetime of the driver, and can compensate for drift and changes in operating characteristics of the driver caused by, for example, voltage and temperature.

If for some reason the impedance at the inverting input of the comparator 508 changes, the differential voltage appearing at the comparator inputs becomes nonzero, thereby causing the comparator output to become positive or negative. The impedance element control circuit 502 responds to the change in impedance by providing a program control output signal, which causes the programmable resistance element 506 to adjust its resistance so that the differential voltage at the comparator inputs is minimized. This impedance is determined by the ratio of the first and second resistors 510, 512, and the value of the external reference resistor 514. By minimizing the differential voltage at the comparator inputs, the termination impedance of the pull-up leg can be made to match the impedance of a transmission line or other off-chip circuit component to which the pull-up leg driver is connected.

Figure 6:
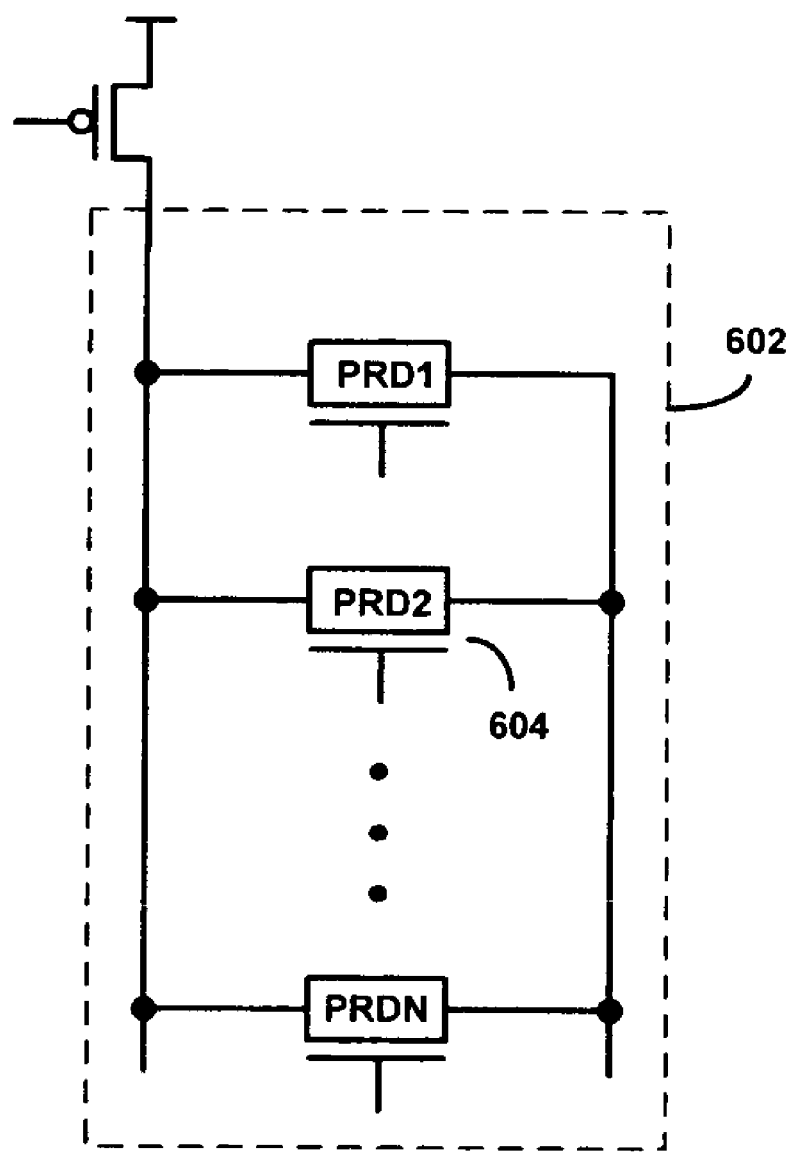
FIG. 6 is a schematic drawing illustrating how the programmable resistance element in FIG. 5 may be implemented using a plurality of parallel connected programmable resistance devices (PRDs)
Figure 7:
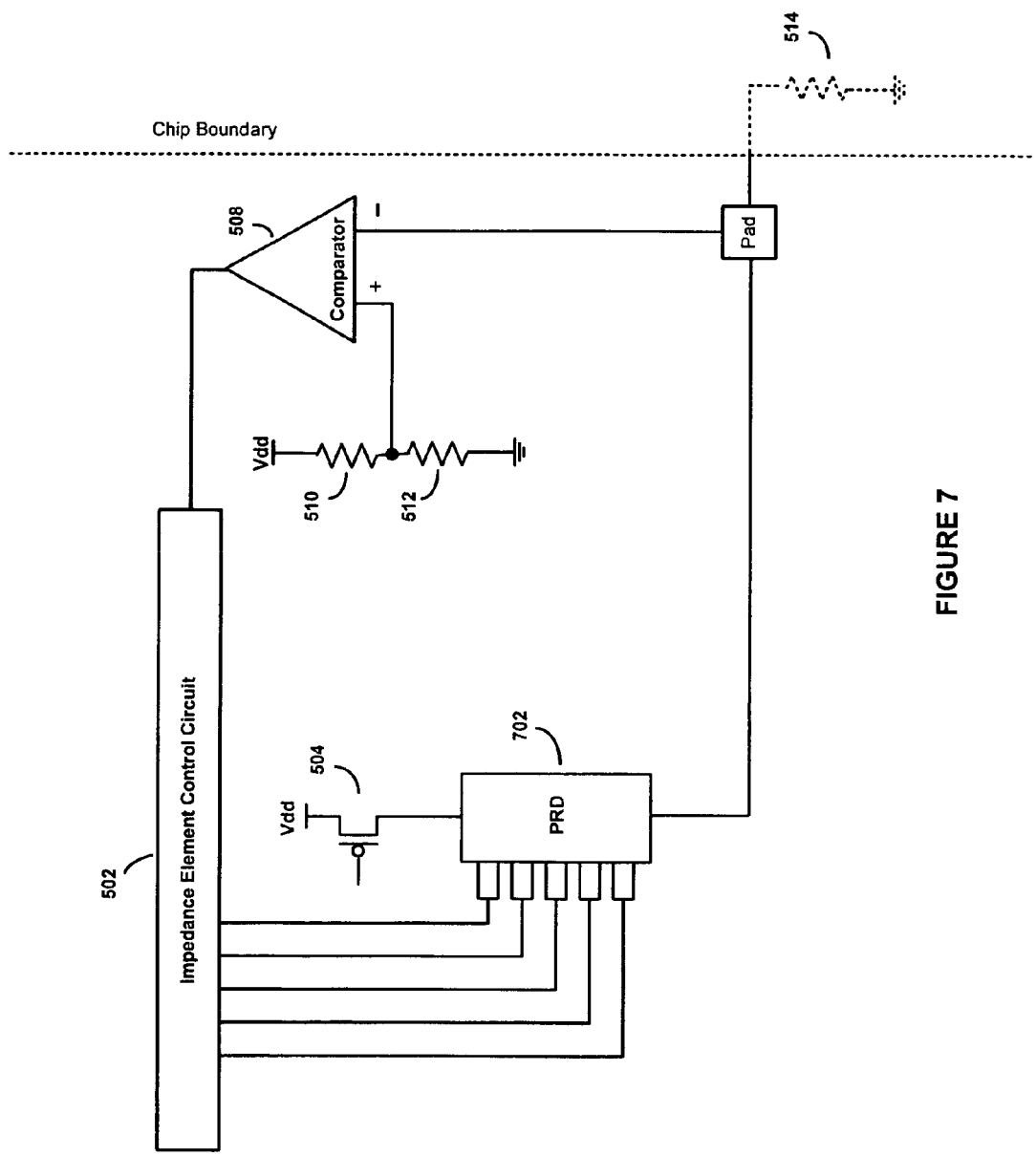
FIG. 7 is a schematic drawing illustrating how a series connected PRD may be used to form the programmable resistance element in FIG. 5, according to an embodiment of the present invention.

The programmable resistance element 506 in FIG. 5 can be implemented in various ways. According to one embodiment shown in FIG. 6, the programmable resistance element is formed using an array 602 of parallel connected programmable resistance devices 604 (PRD1, PRD2, . . . ,PRDN, where N is an integer greater than or equal to one). According to another embodiment shown in FIG. 7, the programmable resistance element in FIG. 5 is formed using a PRD 702 connected in series with the pull-up transistor 504. Control terminals are used to set the resistance of the PRD 702 to a resistance that balances the differential voltage applied to the inputs of the comparator 508. According to one aspect of the invention, the PRD 702 comprises a phase change device (PCD) and the control terminals include heater elements, which are used to adjust the resistivity of the PCD by directing appropriate currents through select portion of a phase change material (PCM) of the PCD. Further details regarding the properties and programming characteristics of PCDs are described below.

Figure 8A:
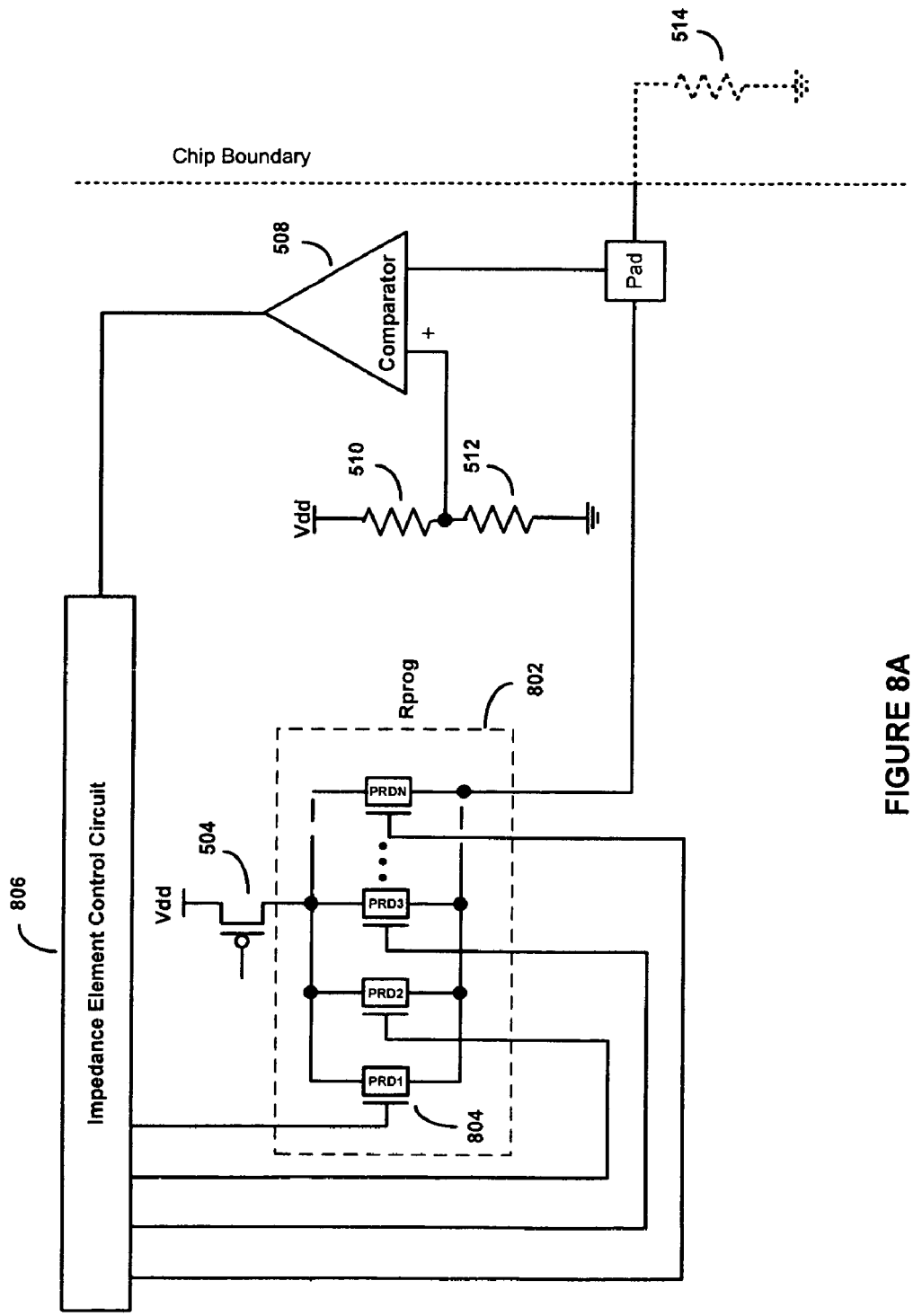
FIG. 8A is a schematic drawing of an exemplary impedance matching apparatus in which an array of PRDs is used to implement the programmable resistance element in the impedance matching apparatus of FIG. 5, according to an embodiment of the present invention.
Figure 8B:
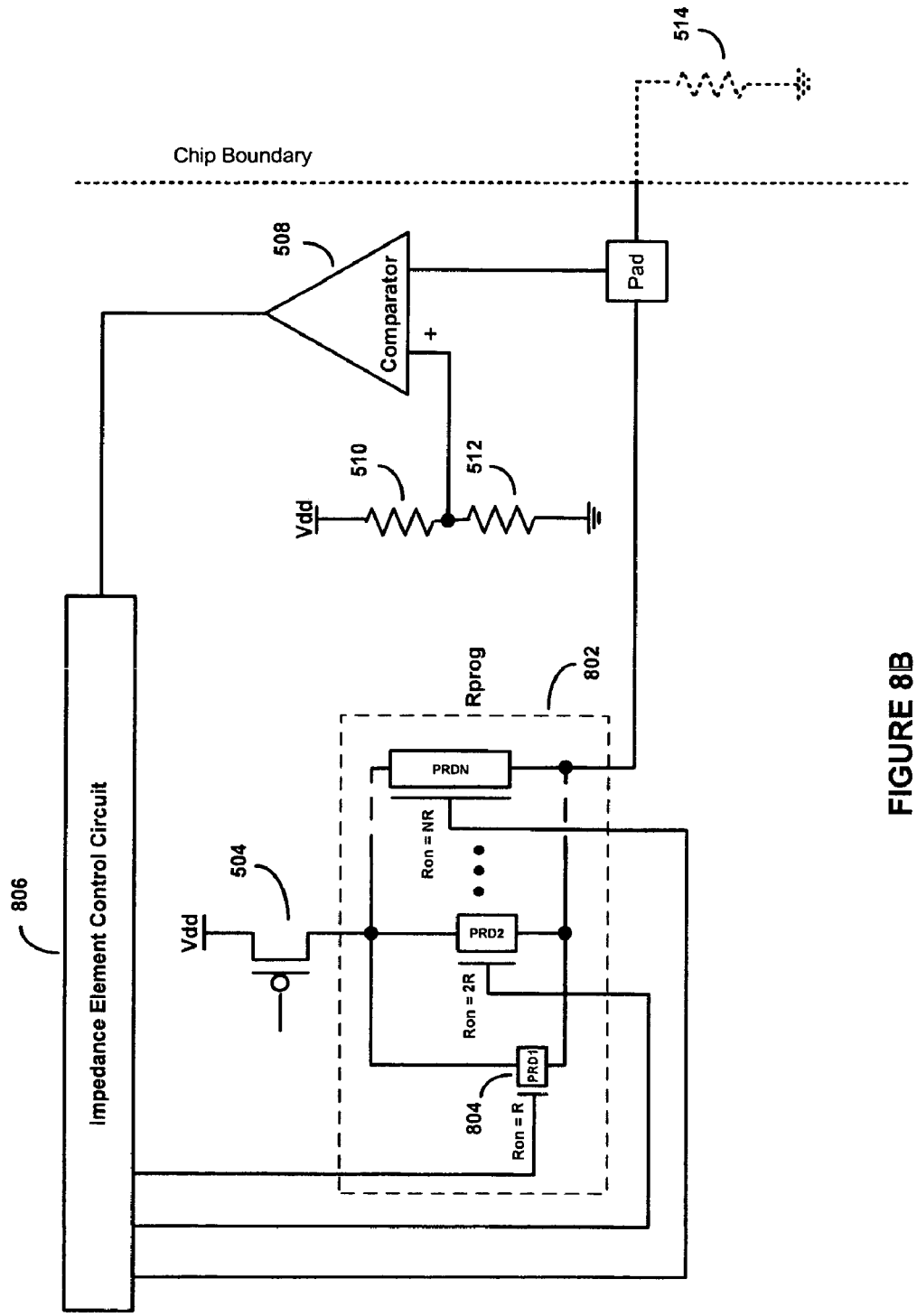
FIG. 8B is a schematic drawing of an exemplary impedance matching apparatus in which an array of PRDs of variable sized PCM elements is used to implement the programmable resistance element in the impedance matching apparatus of FIG. 5, according to an embodiment of the present invention.

According to another embodiment of the invention, shown in FIG. 8A, an array 802 of PRDs 804 (PRD1, PRD2, . . . ,PRDN, where N is an integer greater than or equal to one) is used to form the programmable resistance element 506 in FIG. 5. Program control lines from the impedance element control circuit 806 are coupled to program control terminals of each PRD 804 in the array 802. The impedance element control circuit 806 provides programming pulses to one or more of the PRDs 804, in order to SET, RESET or program select PRDs to low-resistance, high-resistance or intermediate value resistances, as is explained in more detail below. While the array 802 of PRDs 804 in FIG. 8A is shown to include PRDs having the same size (e.g., same volume of PCM in each PRD), in an alternative embodiment the array 802 includes PRDs having different sizes, as shown in FIG. 8B. The different sized PRDs 804 allow further granularity in the adjustment of the programmed resistance value of the array 802.

Figure 9:
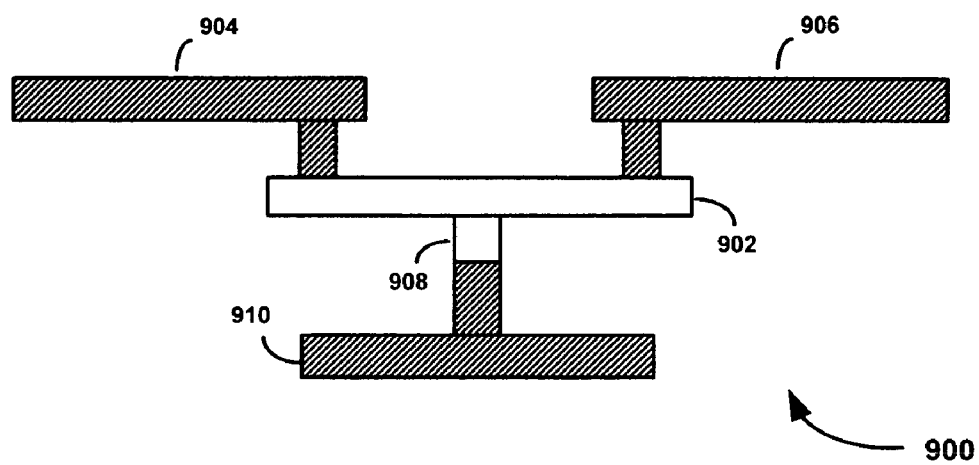
FIG. 9 is a simplified cross-sectional drawing of an exemplary three-terminal phase change device (PCD), which may be used to implement the PRDs in FIGS. 5 and 8A-B, in accordance with an embodiment of the present invention.

According to an aspect of the invention the programmable resistance element 506 in FIG. 5 and the PRDs in other embodiments described herein may comprise multi-terminal phase change devices (PCDs). FIG. 9 is a simplified cross-sectional drawing of an exemplary three-terminal PCD 900, which may be used for these purposes. The three-terminal PCD 900 includes first and second electrically conductive terminals 904 and 906, which are bridged together by a phase change material (PCM) element 902. The PCM element 902 is configured so that it is in both thermal and electrical contact with a heating element 908, which forms part of a program control terminal 910 through which current is applied to the heating element 908 to activate the same. As explained in more detail below, the heating element is activated in a controlled manner to induce a phase change in the PCM element 902.

The PCM element 902 comprises a chalcogenic material or chalcogenic alloy such as, for example, germanium-antimony-tellurium (Ge—Sb—Te), arsenic-antimony-tellurium (As—Sb—Te), tin-antimony-tellurium (Sn—Sb—Te), tantalum-antimony-tellurium (Ta—Sb—Te), niobium-antimony-tellurium (Nb—Sb—Te), vanadium-antimony-tellurium (V—Sb—Te), tantalum-antimony-selenium (Ta—Sb—Se), niobium-antimony-selenium (Nb—Sb—Se), vanadium-antimony-Selenium (V—Sb—Se), tungsten-antimony-tellurium (W—Sb—Te), molybdenum-antimony-tellurium (Mo—Sb—Te), chrome-antimony-tellurium (Cr—Sb—Te), tungsten-antimony-selenium (W—Sb—Se), molybdenum-antimony-selenium (Mo—Sb—Se), chrome-antimony-selenium (Cr—Sb—Se), etc. This list of possible materials for the PCM 702 of the PCD 700 is only exemplary and should not be considered exhaustive. Further, whereas the chalcogenic alloys listed above are ternary chalcogenic alloys, binary chalcogenic alloys (e.g., Ga—Sb, In—Sb, In—Se, $Sb_2$—$Te_3$ or Ge—Te) or quaternary alloys (e.g., As—Ge—Sb—Te, Sn—In—Sb—Te, Ag—In—Sb—Te, (Ge—Sn)—Sb—Te, Ge—Sb—(Se—Te) or $Te_{81}$—$Ge_{15}$—$Sb_2$—$S_2$) may also be used to form the PCM element 902 of the PCD 900.

Figure 10:
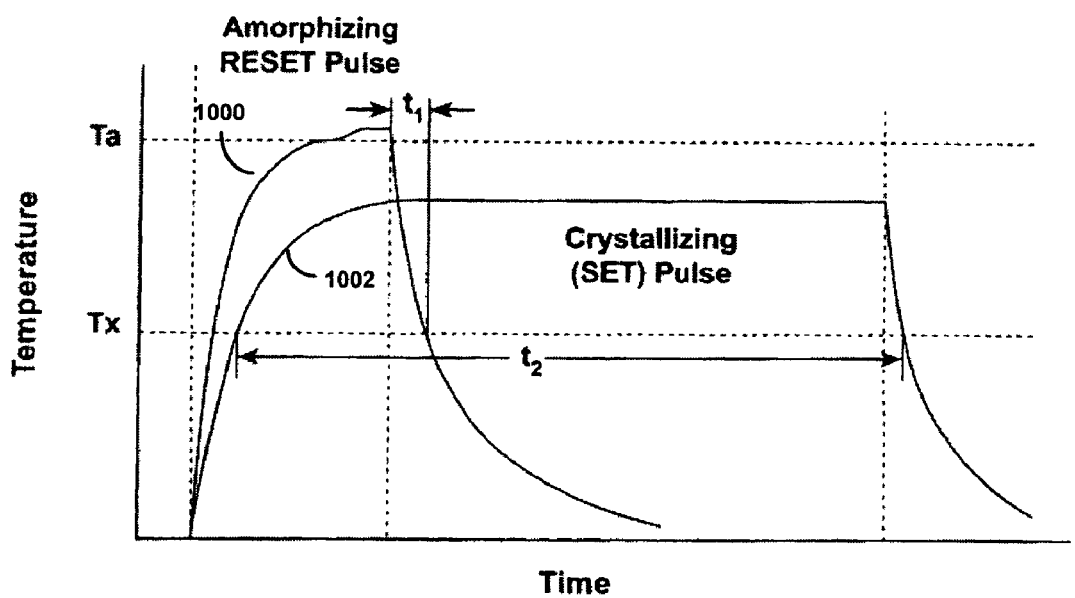
FIG. 10 is a graph showing temperature versus time profiles of a phase change material (PCM) used in the PCD of FIG. 9.

PCM is characterized by its unique ability to change phase between crystalline and amorphous states when exposed to different thermal treatments. As shown in FIG. 10, when the PCM is heated to a temperature above its melting temperature Ta and then abruptly cooled (time t1), as shown by curve 1000, the PCM solidifies (i.e., is "RESET") to an amorphous state. By contrast, when the PCM is heated to a temperature between its melting temperature Ta and its crystallization temperature Tx and then slowly cooled (time t2), as shown by curve 1002, the PCM solidifies to a crystalline state.

When the PCM is in an amorphous state, it exhibits a high resistance to electrical currents. However, when in the crystalline state, it exhibits a low resistance. This property can be exploited to adjust the termination impedances in the impedance matching apparatuses described herein. For example, when a PCD is used to implement the programmable resistance element 506 in the impedance matching apparatus in FIG. 5, and the termination impedance needs to be lowered, the impedance element control circuit 502 transmits a SET pulse on the program control output to the programming input 910 of the PCD 900. The SET pulse 1002 causes the phase change material element 902 in the PCD to SET to a low-resistance state. Conversely, if the termination impedance needs to be raised, the impedance element control circuit 502 transmits a RESET pulse 1000 on the program control output to the programming input 910 of the PCD 900. As shown in FIG. 10, the RESET pulse 1000 causes the phase change material element 902 to change to a high-resistance state. Further details as to how PCDs may be programmed to different resistance states are described in co-pending and commonly assigned U.S. patent application Ser. No. 11/267,788, which is hereby incorporated by reference in its entirety.

While the PCDs have been described as being programmable to two distinct resistance states, by applying appropriate SET and RESET pulses, the PCDs in this and other embodiments of the invention may also be programmed to one or more intermediate resistance states by applying program pulses having controlled characteristics. For example, the programming pulses can be switched in incremental steps by controlling the amplitude and/or other characteristics of the programming pulses, which determine the volume of phase change material converted to the crystalline or amorphous states, depending on the time zeros state of the phase change material. The lowest resistivity state is obtained by converting the entire volume to the crystalline state, while the highest resistivity state is obtained by converting the entire volume to the amorphous state. Intermediate resistivities occur when the amorphous and crystalline states coexist, and can be obtained by controlling the programming pulse characteristics (e.g., amplitude, duration, rise and fall times, repeated application of pulses, etc.)

Figure 11:
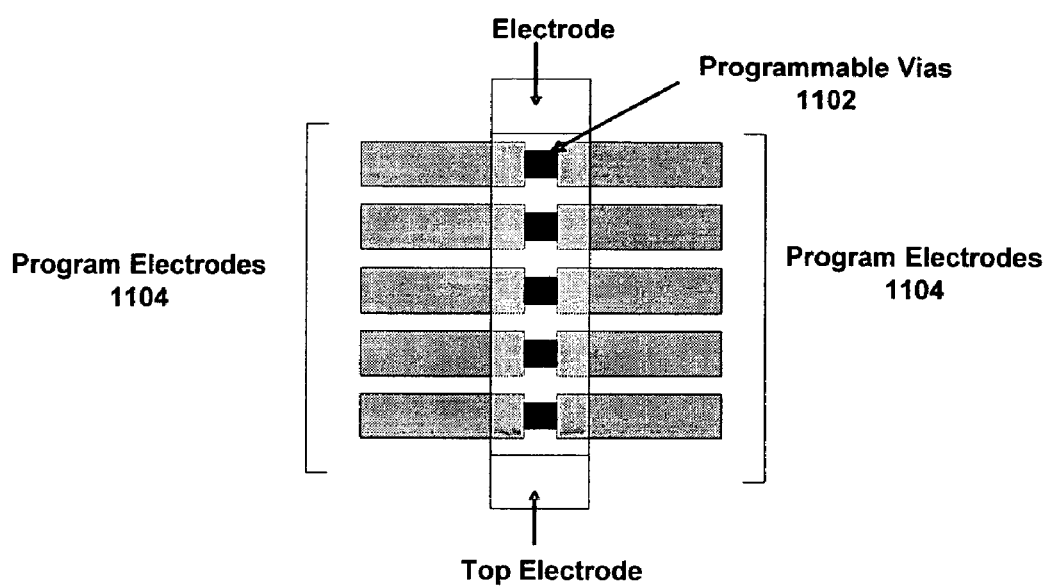
FIG. 11 is a layout view of the impedance matching apparatus in FIG. 8A in which multi-terminal PCDs, similar to that shown in FIG. 9, are configured as programmable memory cells or vias, according to an embodiment of the present invention.

According to an embodiment of the invention, the array 802 of PRDs 804 in FIGS. 8A and 8B, or other multi-terminal PRDs in other embodiment of the invention may be configured as memory cells or programmable vias 1102 sandwiched between program electrodes 1104, as shown in FIG. 11. The memory cells or programmable vias 1102 are turned ON or OFF (i.e., SET or RESET) or are programmed to a predetermined desired resistance in a manner similar to that described above. According to an aspect of the invention, each of the memory cells or programmable vias 1102 includes a phase change material element 902 and associated heater element 908, similar to the multi-terminal PCD 900 shown in FIG. 9. It is estimated, based on current state of the art, that the total area of this particular type of programmable resistor does not exceed the area that would be required to implement a standard polysilicon resistor. The area savings is achieved by eliminating the additional array of transistors and resistors, which are used in prior art impedance matching approaches.

Figure 12:
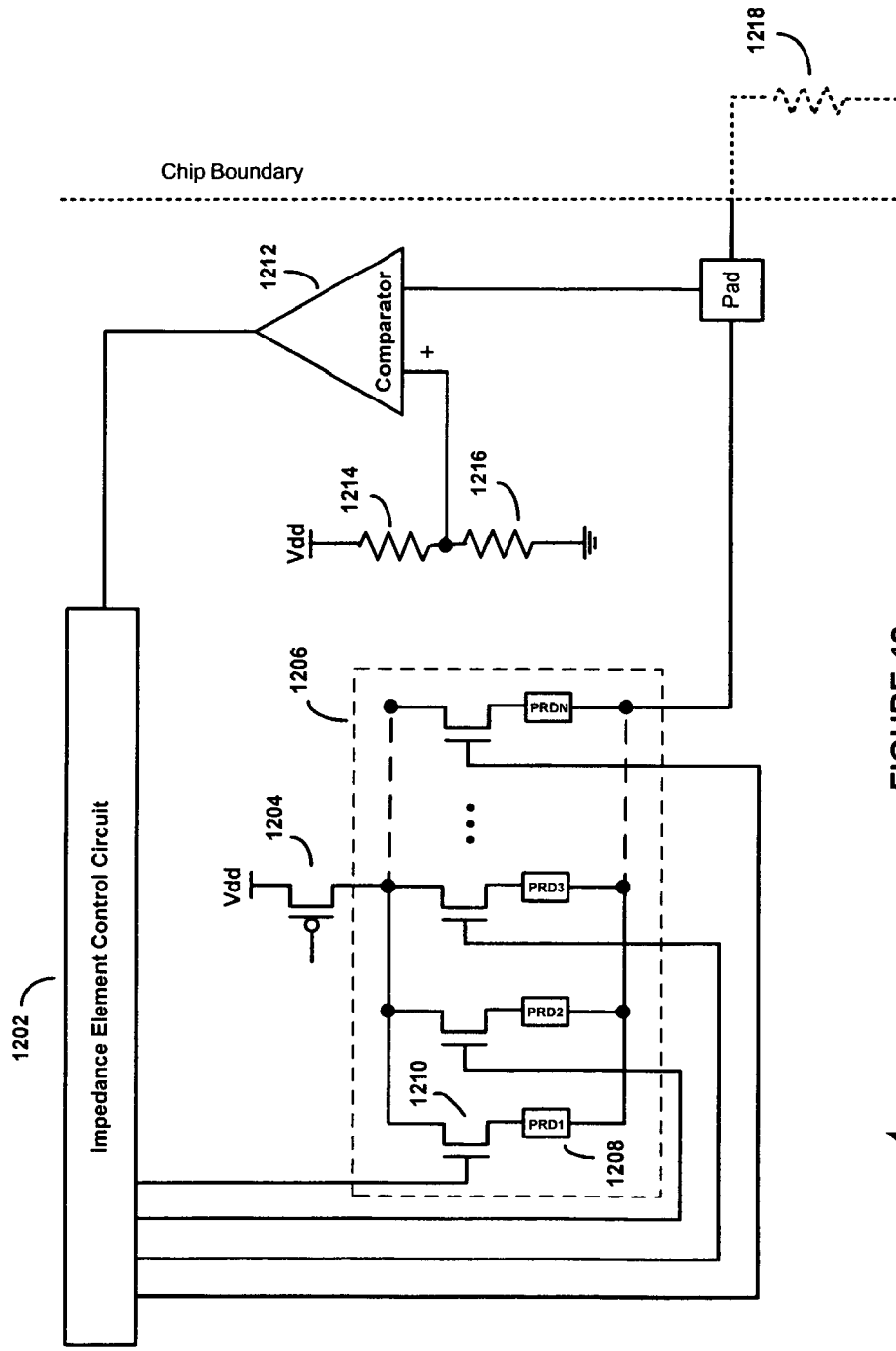
FIG. 12 is a schematic drawing of an exemplary impedance matching apparatus in which two-terminal PRDs are used to implement the programmable resistance element in FIG. 5, according to an embodiment of the present invention.

Whereas multi-terminal PRDs having three or more terminals have been described in the exemplary embodiments above, two-terminal programmable devices (PRDs) may alternatively be used to for impedance matching purposes. FIG. 12 is a schematic drawing of an exemplary impedance matching apparatus 1200 illustrating how two-terminal PRDs may be used to implement the programmable resistance element 506 in the impedance matching apparatus 500 in FIG. 5. The impedance matching apparatus 1200 comprises an impedance element control circuit 1202, a pull-up transistor 1204 (e.g., a pull-up transistor used in a pull-up leg of a driver), a group 1206 of parallel programmable resistance devices (PRDs) 1208, each having an associated access transistor 1210, a comparator 1212, and a resistor divider including first and second resistors 1214 and 1216. The output of the comparator 1212 is coupled to an input of the impedance element control circuit 1202. Program control outputs from the impedance element control circuit 1202 are coupled to the control inputs (i.e., gates) of the access transistors 1210. The pull-up transistor 1204 is coupled between Vdd and the drains of the access transistors 1210. The PRDs 1208 are coupled between the sources of the access transistors 120 and the inverting input of the comparator 1212. A common node of the first and second resistors 1214, 1216 is coupled to the non-inverting input of the comparator 1212.

The comparator 1212 generates an output signal proportional to the difference in voltages applied to its inverting and non-inverting inputs. In response to this output signal, the impedance element control circuit 1202 provides control signals to the control inputs of the access transistors 1210. Depending on the values of the control signals, the PRDs 1208 may be RESET to a high-resistance state, SET to a low resistance state, or programmed to some intermediate resistance state. The combined resistance of the PRDs 1208 and an external reference resistor 1218 form an equivalent resistance, which allows the termination impedance of the pull-up leg to be adjusted so that it matches the impedance of a transmission line or other off-chip component to which the pull-up leg is connected.

If for some reason the impedance at the inverting input of the comparator 1212 changes, the differential voltage appearing at the comparator inputs becomes nonzero, thereby causing the comparator output to become positive or negative. The impedance element control circuit 1202 responds to the change in impedance change by providing program control signals to the access transistors 1210, which allows the PRDs 1208 to increase or decrease their resistance values so that the differential voltage at the comparator inputs is minimized. The PRDs 1208 are programmed by supplying an appropriate voltage/current pulse to the drains of the selected access transistors 1210 to either SET or RESET the selected PRDs 1208 to low or high-resistance states, or program the selected PRDs 1208 to some intermediate resistance state. If necessary, a separate current sinking transistor can be attached to the PRDs 1208 and activated during program operation to facilitate the programming operation. After the selected PRDs 1208 have been programmed to the desired resistance states, the gates of all the access transistors 1210 are turned on to permit normal operation. In this manner, the termination impedance of the pull-up leg can be made to match the impedance of a transmission line to which the pull-up leg is attached.

According to an aspect of the invention, each of the PRDs 1208 used in the impedance matching apparatus 1200 in FIG. 12 comprises a two-terminal phase change device (PCD), which are all of the same size or of different sizes (similar to the embodiments shown in FIGS. 8A and 8B). FIG. 13A is a simplified drawing of a two-terminal PCD 1300, which may be used for this purpose. An electrical schematic of the two-terminal PCD 1300 is shown in FIG. 13B. The two-terminal PCD 1300 comprises a PCM element 1302 and a heating element 1304, which are coupled between first and second conducting terminals 1306, 1308. The heating element 1304 is in both electrical and thermal contact with the PCM element 1302. The PCM element 1302 may be SET and RESET to low-resistance and high-resistance states, respectively, or to some intermediate resistance state, similar to that described above, and may comprise any suitable type of PCM such as, for example, the PCM types describe above.

Figure 14A:
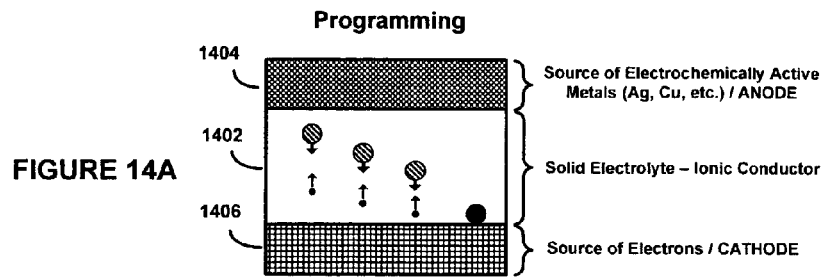
FIG. 14A is a cross-sectional drawing of a programmable metallization cell (PMC) during a SET operation, which may be used to implement the two-terminal PRDs in the impedance matching apparatus of FIG. 12, in accordance with an embodiment of the present invention.
Figure 14B:
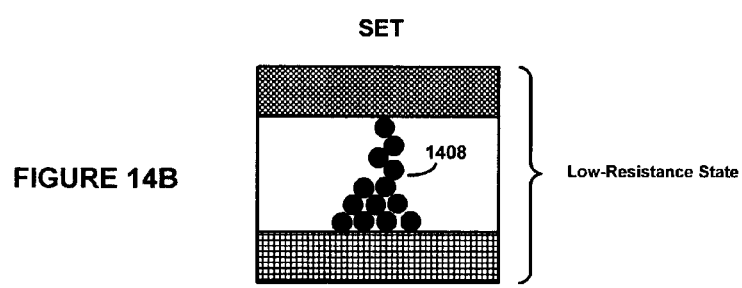
FIG. 14B is a cross-sectional view of the PMC in FIG. 14A after the PMC has been SET to a low-resistance state.

As an alternative to using PCDs, the PRDs 1208 in FIG. 12 may be implemented using programmable metallization devices (PMCs). As shown in FIG. 14A, a PMC 1400 comprises a solid electrolyte 1402 such as, for example, silver selenide ($Ag_2Se$), which is formed between an electrochemically active metallic anode 1404, (e.g., Ag, Cu, etc.) and a cathode 1406, which operates as a source of electrons. Similar to a PCD, a PMC is nonvolatile, and may be configured between SET and RESET states over and over again. FIG. 14B shows the PMC 1400 in a programmed (i.e., SET) low-resistance state. The PMC 1400 is programmed by applying a voltage ($V_{anode} > V_{cathode}$) across the cell. As shown in FIG. 14A, the applied bias causes electrons from the cathode 1406 and $Ag^+$ ions from the anode 1404 to be injected into the electrolyte 1402, where they are reduced ($M^+ + e^- \rightarrow M^0$) into Ag atoms. The reaction continues until a conductive chain 1408 of Ag atoms is formed between the anode 1404 and cathode 1406, as shown in FIG. 14B. Further details describing the construction and operation of the PMC 1400 are described in M. Kozicki et al., "Nanoscale Memory Elements Based on Solid State Electrolyte," which is hereby incorporated into the present disclosure by reference.

Figure 14C:
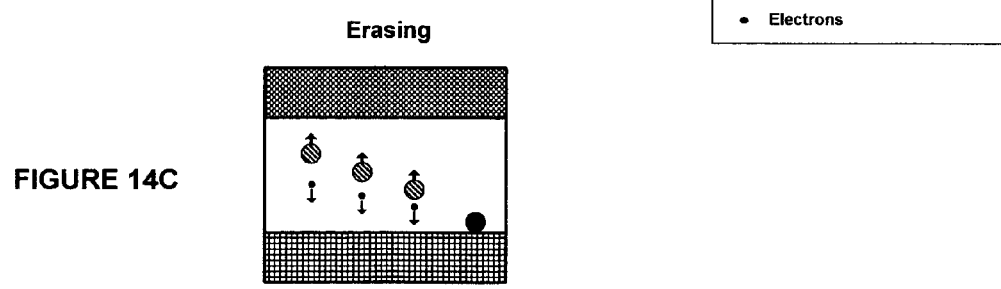
FIG. 14C is a cross-sectional drawing of a PMC during a RESET operation.
Figure 14D:
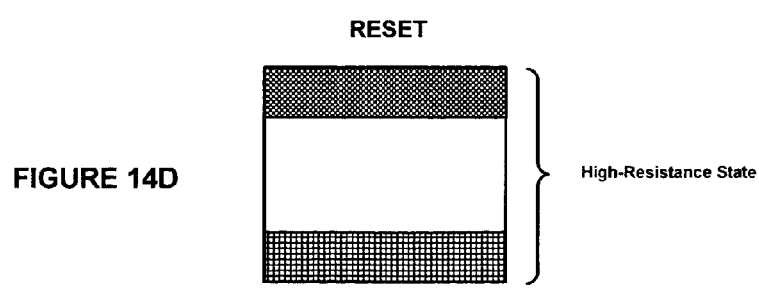
FIG. 14D is a cross-sectional view of the PMC in FIG. 14C after the PMC has been RESET to a high-resistance state.

When PMCs are used to implement the PRDs 1208 in FIG. 12, and the impedance of the group 1206 of PMCs needs to be lowered, the impedance element control circuit 1202 SETs one or more of the PMCs by turning on the gate of the associated access transistor 1210, turning off the gates of the other access transistors 1210, and then supplying appropriate voltage signals to the drains of the selected access transistor 1210 to SET the selected PMCs to the desired low resistance state. Conversely, if the impedance of the group 1206 of PMCs needs to be increased, the impedance element control circuit 1202 provides control signals to the gates of one or more of the access transistors 1210, after which a RESET voltage signal having a polarity opposite that used to SET the cell is applied across the selected PMCs. The applied voltage causes Ag atoms in the electrolyte 1402 to ionize. As illustrated in FIG. 14C, the ionization process creates $Ag^+$ ions and electrons, which are attracted to and collected by anode 1404 and cathode 1406 respectively. Eventually the selected cells are completely RESET as illustrated by the RESET condition in FIG. 14D.

During integrated circuit fabrication, the PRDs in the various embodiments described above are fabricated as part of Back End of Line (BEOL) processing, i.e., after the first metallization layer (M1) has been laid down. Hence, the PRDs do not require significant chip area, and because the PRDs can be fabricated above active semiconductor layers, the only area penalty incurred relates to the area needed to form the contacts of the devices.

Figure 15:
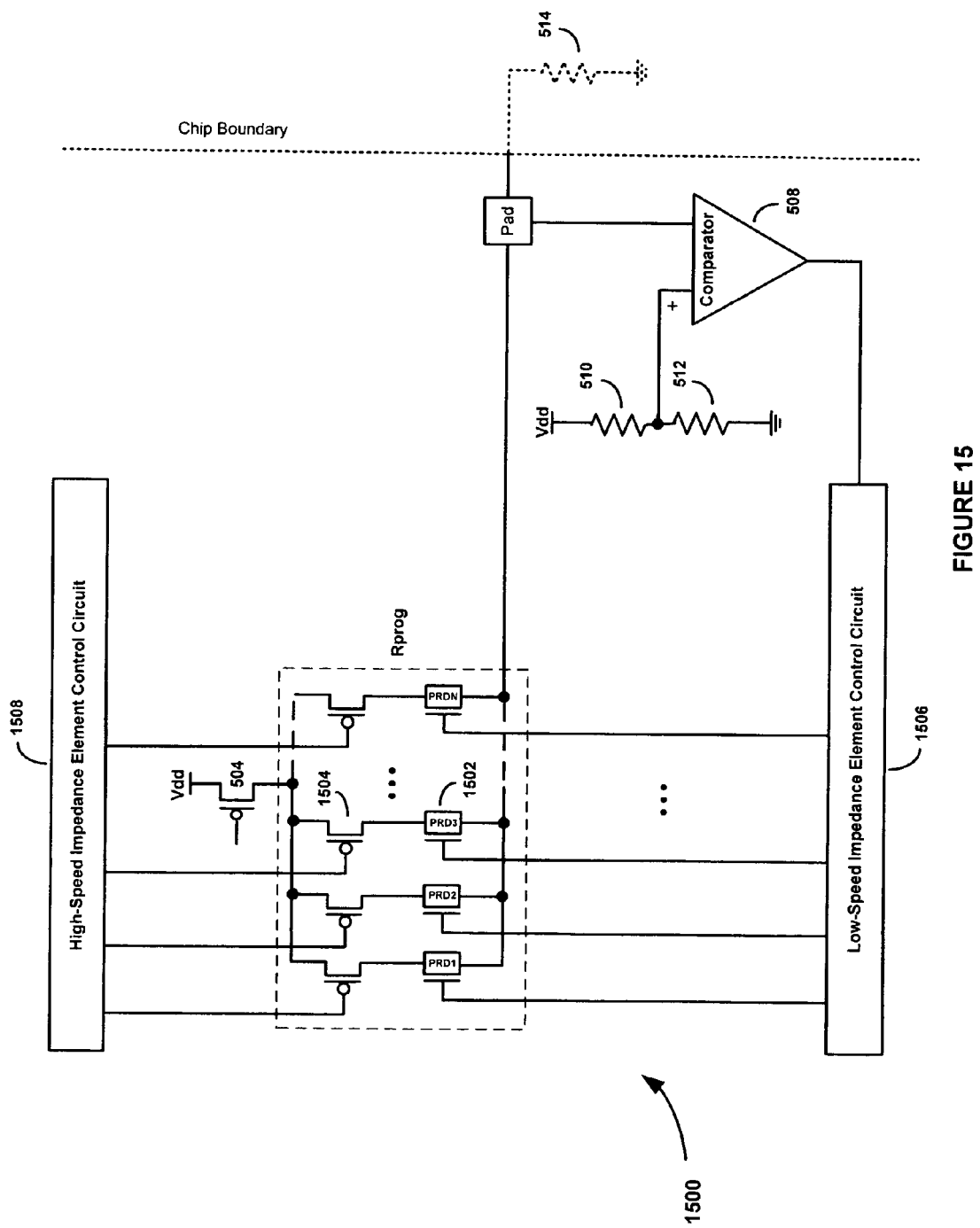
FIG. 15 is a schematic drawing of an exemplary hybrid technology impedance matching apparatus in which complementary metal-oxide-semiconductor (CMOS) transistors are combined with the PRDs, according to an embodiment of the present invention.

While the various exemplary PRDs described above (e.g., PCDs and PMCs) may be exclusively used to implement the programmable resistance functions of the trimming and impedance matching apparatuses described herein, the PRDs may also be combined with other device and integrated circuit technologies. For example the PRDs may be employed to produce hybrid trimming and impedance matching structures, which integrate the PRDs with polysilicon resistors, complementary metal-oxide-semiconductor (CMOS) integrated circuit technology, and/or source/drain resistor or well resistor resistors or other circuit devices and/or integrated circuit technologies. As an example, FIG. 15 illustrates how complementary metal-oxide-semiconductor (CMOS) transistors can be combined with one or more of the PRDs described above, to form a hybrid-technology impedance matching apparatus 1500, according to an embodiment of the present invention. As shown, the impedance matching apparatus 1500 comprises one or more PRDs 1502 (or an array of PRDs similar to as in FIGS. 8A-B) coupled in series with one or more program/select transistors 1504, a low-speed impedance element control circuit 1506 and a high-speed impedance element control circuit 1508. Those of ordinary skill in the art will readily appreciate and understand, based on the teachings of this disclosure, that a similar apparatus can be formed using two-terminal PRDs. Program control lines from the low-speed impedance element control circuit 1506 are coupled to program control terminals of each of the PRDs 1502. Transistor select lines from the high-speed impedance element control circuit 1508 are coupled to the gates of the program/select transistors 1504. The sources of the program/select transistors are coupled to a pull-up transistor 504 (e.g., a pull-up transistor used in a pull-up leg of a driver) for which the impedance matching is performed.

The CMOS program/select transistors 1504 are used to facilitate the programming of the PRDs 1502 and to select or deselect PRDs (i.e., include or exclude certain PRDs 1502 in the collective programmable resistor). When a particular PRD 1502 needs to be programmed, the program/select transistor 1504 associated with the PRD to be programmed is turned ON, thereby providing a current path for the programming operation. Similar to the embodiments described above, each PRD 1502 may be programmed to a unique resistance value (e.g., SET to a low-resistance state, RESET to a high-resistance state, or programmed to some intermediate resistance value, similar to as described above). Because a programming cycle generally takes more time to complete than the switching time of the program/select transistors 1504, the program/select transistors 1504 are used to select or deselect PRDs during operation to quickly and dynamically effect an adjustment of the collective programmed resistance, thereby providing an appropriate impedance matched termination.

The foregoing description of the embodiments of the invention has been presented for the purposes of illustration and description. It is not intended to be exhaustive or to limit the invention to the precise form disclosed. For example, while exemplary embodiments have been described in the context of impedance matching, the programmable resistance elements may also be used in other applications in which a resistance must be trimmed or maintained at a desired value, e.g., to compensate for factors such as process variations, circuit life, and operating conditions (e.g. temperature and voltage variations). The various embodiments may also be adapted to compensate for drifts in other operational parameters, for example, output amplitude of I/O drivers subject to transistor parameter drifts caused by hot carrier injection. Finally, while various examples of different PRD types (e.g., PCDs and PMCs) have been disclosed, other types of non-volatile PRDs may be used. For example, carbon nanotube nanoelectromechanical (NEM) device technologies may also be used to implement the PRDs. Other modifications and variations are possible in light of the above teachings. Accordingly, it is intended that the scope of the invention not be limited by the specifically disclosed exemplary embodiments, but only by the claims and the equivalents to the claims appended hereto.

What is claimed is:

1. An adjustable impedance matching circuit, comprising: a nonvolatile reprogrammable resistance device having a plurality of phase change devices (PCD), wherein each of said plurality of PCDs includes a first electrical conductive terminal, a second electrical conductive terminal, a phase change material (PCM) element, a heating element, a program control terminal, wherein said heating element is in thermal and electrical contact with said PCM, said program control terminal configured to provide a first electrical current to said first electrical conductive terminal passing through said heating element for controlling resistance of said PCM, wherein said first electrical conductive terminal and said second electrical conductive terminal are coupled via said PCM element which facilitates a passage of a second electrical current traveling from said first electrical conductive terminal to said second electrical conductive terminal in accordance with resistance of said PCM element, wherein resistance of each PCM element varies in response to temperature of said heating element; and a control circuit coupled to said nonvolatile reprogrammable resistance device and configured to generate control signals used to program said nonvolatile reprogrammable resistance device.

2. The adjustable impedance matching circuit of claim 1, further comprising a detection circuit coupled to said nonvolatile reprogrammable resistance device, said detection circuit operable to detect an impedance mismatch between said driver circuit and a load external to the adjustable impedance matching circuit.

3. The adjustable impedance matching circuit of claim 1 wherein said nonvolatile reprogrammable resistance device comprises one or more chalcogenide-based phase change devices (PCDs).

4. The adjustable impedance matching circuit of claim 3 wherein said one or more PCDs comprises a plurality of parallel connected PCDs.

5. The adjustable impedance matching circuit of claim 1 wherein said nonvolatile reprogrammable resistance device comprises one or more programmable memory elements.

6. The adjustable impedance matching circuit of claim 5 wherein said one or more programmable memory elements include one or more chalcogenide-based phase change material devices (PCDs).

7. The adjustable impedance matching circuit of claim 1 wherein said nonvolatile reprogrammable resistance device comprises one or more programmable metallization cells (PMCs).

8. The adjustable impedance matching circuit of claim 1 wherein said nonvolatile reprogrammable resistance device comprises a plurality of nonvolatile reprogrammable resistance devices of different sizes.

9. The adjustable impedance matching circuit of claim 1 wherein said nonvolatile reprogrammable resistance device comprises one or more nanoelectromechanical (NEM) devices.

10. An integrated circuit having an on-chip impedance matching circuit for matching an on-chip impedance to an off-chip impedance, comprising: a nonvolatile reprogrammable resistance device having a plurality of phase change devices (PCDs), wherein each of said plurality of PCDs includes a first electrical conductive terminal, a second electrical conductive terminal, a phase change material (PCM) element, a heating element, a program control terminal, wherein said heating element is in thermal and electrical contact with said PCM, said program terminal configured to forward a first electrical current to said first electrical conductive terminal passing through said heating element for controlling resistance of said PCM, wherein said first electrical conductive terminal and said second electrical conductive terminal are coupled via said PCM element which facilitates a passage of a second electrical current traveling from said first electrical conductive terminal to said second electrical conductive terminal in accordance with resistance of said PCM element, wherein resistance of each PCM element varies in response to temperature of said heating element; and a circuit operable to adjust the impedance of said nonvolatile reprogrammable resistance device when said on-chip impedance does not match said off-chip impedance.

11. The integrated circuit of claim 10 wherein said circuit is operable to adjust the impedance of said nonvolatile reprogrammable resistance device dynamically during operation of said integrated circuit.

12. The integrated circuit of claim 10 wherein said nonvolatile reprogrammable resistance device comprises one or more chalcogenide-based phase change devices (PCDs).

13. The integrated circuit of claim 12 wherein said one or more PCDs comprises a plurality of PCDs connected in parallel.

14. The integrated circuit of claim 12 wherein each of said plurality of PCDs comprises a program control terminal capable of applying a current to said heating element.

15. The integrated circuit of claim 10 wherein said nonvolatile reprogrammable resistance device comprises one or more programmable memory elements.

16. The integrated circuit of claim 15 wherein each of said one or more programmable memory elements includes a chalcogenide-based phase change material.

17. The integrated circuit of claim 10 wherein said nonvolatile reprogrammable resistance device comprises one or more programmable metallization devices (PMCs).

18. The integrated circuit of claim 10 wherein said nonvolatile reprogrammable resistance device comprises a plurality of nonvolatile reprogrammable resistance devices of different sizes.

19. The integrated circuit of claim 10 wherein said nonvolatile reprogrammable resistance device comprises one or more nanoelectromechanical (NEM) devices.

20. A method of matching an on-chip impedance of an integrated circuit to an off-chip impedance, comprising: determining that an on-chip impedance does not match an off-chip impedance; identifying impedance difference between said on-chip impedance and said off-chip impedance; generating a first electrical current in accordance with said impedance difference; allowing said first electrical current to travel from a program control terminal to a heating element and from said heating element to a portion of a phase change device via a thermal and electrical contact between said heat element and said phase change device before reaching a first electrical conductive terminal; and adjusting an on-chip nonvolatile reprogrammable resistance device to reduce the difference between said on-chip impedance and said off-chip impedance to provide an impedance matched termination; wherein adjusting an on-chip nonvolatile reprogrammable resistance device further includes facilitating an electrical coupling between said first electrical conductive terminal and a second electrical conductive terminal and allowing a passage of second electrical current traveling from said first electrical conductive terminal to said second electrical conductive terminal in accordance with resistance of a phase change material (PCM) element.

21. The method of claim 20 wherein said on-chip impedance comprises a combined impedance of an on-chip driver circuit and an impedance of said nonvolatile reprogrammable resistance device.

22. The method of claim 21 wherein said nonvolatile reprogrammable resistance device comprises one or more chalcogenide-based phase change devices (PCDs).

23. The method of claim 22 wherein said one or more PCDs comprises a plurality of parallel connected PCDs.

24. The method of claim 22 wherein said adjusting an on-chip nonvolatile reprogrammable resistance device further includes applying a current to one of said heating element to change resistance of a phase change material (PCM) element.

25. The method of claim 20 wherein said nonvolatile reprogrammable resistance device comprises one or more memory elements.

26. The method of claim 25 wherein each of said one or more memory elements includes a chalcogenide-based phase change material.

27. The method of claim 20 wherein said nonvolatile reprogrammable resistance device comprises one or more programmable memory cells (PMCs).

28. The method of claim 20 wherein said nonvolatile reprogrammable resistance device comprises a plurality of nonvolatile reprogrammable resistance devices of different sizes.

29. The method of claim 20 wherein said nonvolatile reprogrammable resistance device comprises one or more nanoelectromechanical (NEM) devices.

30. An integrated circuit, comprising: a drive circuit including a nonvolatile reprogrammable resistance device having a plurality of phase change devices (PCDs), wherein each of said plurality of PCDs includes a first electrical conductive terminal, a second electrical conductive terminal, a phase change material (PCM) element, a heating element, a program control terminal, wherein said heating element is in thermal and electrical contact with said PCM, said program control terminal configured to forward a first electrical current to said first electrical conductive terminal passing through said heating element for controlling resistance of said PCM, wherein said first electrical conductive terminal and said second electrical conductive terminal are coupled via said PCM element which facilitates a passage of a second electrical current traveling from said first electrical conductive terminal to said second electrical conductive terminal in accordance with resistance of said PCM element, wherein resistance of each PCM element varies in response to temperature of said heating element; and a control circuit operable to adjust the resistance of said nonvolatile reprogrammable resistance device from an untrimmed resistance value to a desired, trimmed resistance value.

31. The integrated circuit of claim 30 wherein said nonvolatile reprogrammable resistance device comprises one or more chalcogenide-based phase change device (PCDs).

32. The integrated circuit of claim 31 wherein said one or more PCDs comprises a plurality of parallel connected PCDs.

33. The integrated circuit of claim 31 wherein each of said plurality of PCDs comprises a program control terminal capable of applying a current to said heating element.

34. The integrated circuit of claim 30 wherein said nonvolatile reprogrammable resistance device comprises one or more memory elements.

35. The integrated circuit of claim 34 wherein each of said one or more memory elements includes a chalcogenide-based phase change material.

36. The integrated circuit of claim 30 wherein said nonvolatile reprogrammable resistance device comprises one or more programmable memory cells (PMCs).

37. The integrated circuit of claim 30 wherein said nonvolatile reprogrammable resistance device comprises a plurality of nonvolatile reprogrammable resistance devices of different sizes.

38. The integrated circuit of claim 30 wherein said nonvolatile reprogrammable resistance device comprises one or more nanoelectromechanical (NEM) devices.

* * * * *

UNITED STATES PATENT AND TRADEMARK OFFICE
CERTIFICATE OF CORRECTION

PATENT NO. : 8,222,917 B2
APPLICATION NO. : 11/591734
DATED : July 17, 2012
INVENTOR(S) : Antonietta Oliva et al.

Page 1 of 1

It is certified that error appears in the above-identified patent and that said Letters Patent is hereby corrected as shown below:

Title Page, item 75, in INVENTORS line 2, replace "Louis Charles Kordus" with "Louis Charles Kordus II"

Signed and Sealed this
Twenty-third Day of October, 2012

David J. Kappos
*Director of the United States Patent and Trademark Office*